(12) United States Patent
Verschuuren et al.

(10) Patent No.: US 10,444,412 B2
(45) Date of Patent: Oct. 15, 2019

(54) SOLID STATE ILLUMINATION DEVICE HAVING PLASMONIC ANTENNA ARRAY FOR ANISOTROPIC EMISSION

(71) Applicant: KONINKLIJKE PHILIPS N.V., Eindhoven (NL)

(72) Inventors: Marcus Antonius Verschuuren, Eindhoven (NL); Said Rahimzadeh Kalaleh Rodriguez, Eindhoven (NL); Gabriel Sebastian Lozano Barbero, Eindhoven (NL); Sunsuke Murai, Eindhoven (NL); Jaime Gomez Rivas, Eindhoven (NL); Davy Louwers, Eindhoven (NL); Dirk Kornelis Gerhardus De Boer, Eindhoven (NL); Marius Gabriel Ivan, Eindhoven (NL); Rifat Ata Mustafa Hikmet, Eindhoven (NL); Ties Van Bommel, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 585 days.

(21) Appl. No.: 14/909,904

(22) PCT Filed: Jul. 23, 2014

(86) PCT No.: PCT/IB2014/063337
§ 371 (c)(1),
(2) Date: Feb. 3, 2016

(87) PCT Pub. No.: WO2015/019229
PCT Pub. Date: Feb. 12, 2015

(65) Prior Publication Data
US 2016/0161644 A1    Jun. 9, 2016

(30) Foreign Application Priority Data

Aug. 6, 2013   (EP) .................................... 13179374
Jan. 3, 2014   (EP) .................................... 14150095

(51) Int. Cl.
*G02B 5/00*   (2006.01)
*H01L 33/50*   (2010.01)
(Continued)

(52) U.S. Cl.
CPC ............ *G02B 5/008* (2013.01); *H01L 33/508* (2013.01); *H01L 33/58* (2013.01); *H01S 5/005* (2013.01)

(58) Field of Classification Search
CPC ....... G02B 5/008; G02B 6/1226; H01S 5/005; H01L 33/508; H01L 33/58
See application file for complete search history.

(56) References Cited

U.S. PATENT DOCUMENTS 7,999,353 B1   8/2011   Odom et al.
8,948,561 B2 *  2/2015   Wiersma .................. G02B 6/02
                                                 136/252

(Continued)

FOREIGN PATENT DOCUMENTS

EP      2477240 A1    7/2012
WO   2011050272 A2    4/2011

(Continued)

OTHER PUBLICATIONS

Aksu, Serap et al. "High-thoroughput Nanofabrication of Infrared Plasmonic Nanoantenna Arrays for Vibrational Nanospectrosopy" American Chemical Society, Nano Letters, 2511-2518, Published Jun. 18, 2010.*

(Continued)

*Primary Examiner* — Brooke Purinton (57) ABSTRACT

There is provided an illumination device (100, 150, 200, 300) comprising: a periodic plasmonic antenna array (114), comprising a plurality of individual antenna elements (106) arranged in an antenna array plane, the plasmonic antenna array being configured to support surface lattice resonances (Continued)

at a first wavelength, arising from diffractive coupling of localized surface plasmon resonances in the individual antenna elements; a photon emitter (152) configured to emit photons at the first wavelength, the photon emitter being arranged in close proximity of the plasmonic antenna array such that at least a portion of the emitted photons are emitted by a coupled system comprising said photon emitter and said plasmonic antenna array, wherein the plasmonic antenna array is configured to comprise plasmon resonance modes being out-of plane asymmetric, such that light emitted from the plasmonic antenna array has an anisotropic angle distribution.

16 Claims, 7 Drawing Sheets

(51) Int. Cl.
   *H01L 33/58* (2010.01)
   *H01S 5/00* (2006.01)

(56) References Cited

U.S. PATENT DOCUMENTS

| | | | |
|---|---|---|---|
| 9,588,292 B2* | 3/2017 | Yu | ................... G02B 6/1226 |
| 2005/0053974 A1 | 3/2005 | Lakowicz et al. | |
| 2011/0294295 A1 | 12/2011 | Zhu et al. | |
| 2012/0314189 A1 | 12/2012 | Natsumeda et al. | |
| 2014/0139809 A1 | 5/2014 | Natsumeda et al. | |

FOREIGN PATENT DOCUMENTS

| | | |
|---|---|---|
| WO | 2012098487 A1 | 7/2012 |
| WO | 2013093696 A2 | 6/2013 |

OTHER PUBLICATIONS

Japan Office Action dated Feb. 13, 2018, Japan Patent Application No. 2016-532765, 5 pages.
Second Office Action dated Feb. 24, 2018, China Patent Application No. 201480044238.2, 7 pgs.
CN First Office Action dated Jun. 23, 2017, China Patent Application No. 201480044238.2, 15 pages.
Article 94(3) EPC dated Sep. 1, 2017, European Patent Application No. 14752951.5, 4 pages.
Extended European Search Report dated Jan. 8, 2014, European Application No. 13179374.7, 8 pages.
Vecchi, et al. "Shaping the Fluorescent Emission by Lattice Resonances in Plasmonic Crystals of Nanoantennas", Physical Review Letters, Apr. 10, 2009, vol. 102, No. 14, pp. 146807-1/4.
EPO as ISA, PCT/IB2014/063337, filed Jul. 23, 2014, "International Search Report and Written Opinion" dated Oct. 1, 2014, 13 pages.

\* cited by examiner

SOLID STATE ILLUMINATION DEVICE HAVING PLASMONIC ANTENNA ARRAY FOR ANISOTROPIC EMISSION

CROSS-REFERENCE TO RELATED APPLICATIONS

The present application is a § 371 application of International Application No. PCT/IB2014/063337 filed on Jul. 23, 2014 and entitled "SOLID STATE ILLUMINATION DEVICE HAVING PLASMONIC ANTENNA ARRAY FOR ANISOTROPIC EMISSION," which claims priority to European Application Nos. 13179374.7, filed Aug. 6, 2013 and 14150095.9, filed Jan. 3, 2014. PCT/IB2014/063337, 13179374.7, and 14150095.9 are incorporated herein.

FIELD OF THE INVENTION

The present invention relates to an illumination device. In particular, the present invention related to an illumination device having improved emission properties.

TECHNICAL BACKGROUND

For light emitting diodes (LEDs) for use in lighting applications, it is desirable to provide essentially white light having a color temperature approximately comparable to that produced by incandescent lighting.

White light from LEDs is commonly provided by using a pn-diode emitting blue light, having a wavelength around 450 nm, where part of the blue light is converted to longer wavelengths using one or more wavelength converting materials arranged on top of or in the vicinity of the diode. By combining the converted light with the unabsorbed blue light, a reasonably broadband spectrum which is perceived as white light can be obtained.

Currently, in most commercial applications, the wavelength converting material is applied directly on the LED. Furthermore, the wavelength converting material should be scattering in order to obtain a low variation in color over angle. This means that blue light will also be scattered back into the diode which leads to absorption losses in the LED. Moreover, the active component of the wavelength converting material, commonly phosphor, is an isotropic emitter, meaning that the same amount of wavelength converted light is emitted in all directions. This leads to further losses as only a portion of the light escapes through the output surface of the light emitting device.

The problem of reducing losses has for example been addressed by using a phosphor which is less scattering to reduce the amount of blue light which is backscattered and absorbed by the diode. However, the isotropic emission from the phosphor remains.

The amount of light leaving the light emitting device may also be increased by introducing a photonic band gap material in which the emission direction can be modified. However, to be able to control the emission direction, a photonic band gap material needs to be made from materials having a high refractive index contrast, high aspect ratio holes or pillars must be patterned and formed, the size control is very strict and the material must be luminescent which will incur scattering losses. Furthermore, a photonic band gap material is only really effective in the plane perpendicular to the surface of the material, i.e. in a direction parallel to the holes or pillars.

Accordingly, the suggested approaches for increasing the emission efficiency of a light emitting device suffer from inherent drawbacks which are hard to overcome.

SUMMARY OF THE INVENTION

In view of the above-mentioned desired properties of a light emitting device, and the above-mentioned and other drawbacks of the prior art, it is an object of the present invention to provide an improved light emitting device.

According to a first aspect of the invention, there is provided an illumination device comprising: a periodic plasmonic antenna array, comprising a plurality of individual antenna elements arranged in an antenna array plane, the plasmonic antenna array being configured to support surface lattice resonances at a first wavelength, arising from diffractive coupling of localized surface plasmon resonances in the individual antenna elements; a photon emitter configured to emit photons at the first wavelength, the photon emitter being arranged in close proximity of the plasmonic antenna array such that at least a portion of the emitted photons are emitted by a coupled system comprising said photon emitter and said plasmonic antenna array, wherein the plasmonic antenna array is configured to comprise plasmon resonance modes being out-of plane asymmetric, such that light emitted from the plasmonic antenna array has an anisotropic angle distribution.

The field of plasmonics refers to the interaction of small conducting structures, typically metal structures, with light, whereby the size of the metal structures is similar to the wavelength of the light. The conduction electrons in the metal respond to an external electric field and the electron cloud oscillates at the driving optical frequency, leaving behind a more positive charged area, which pulls the electrons back. Due the small size of the metal structures, the resonances can reach the frequencies of visible light. As a result, a metal structure can have a large scatter cross-section which allows a strong interaction with any light that is incident on them or light that is generated in close proximity to the metal particles.

It has been found that regular arrays exhibit strong enhancement in directionality of the emission which is attributed to hybrid coupled LSPR (Localized Surface Plasmon Resonance) and photonic modes.

Ordered arrays of optical antennas support collective resonances. When the wavelength of the radiation is on the order of the periodicity of the array, a diffracted order can radiate in the plane of the array. This way the localized surface plasmon polaritons sustained by the individual particles may couple via diffraction leading to collective, lattice-induced, hybrid photonic-plasmonic resonances known as surface lattice resonances (SLRs). These delocalized modes extend over several unit cells, making it possible to obtain a collective enhancement of the emission from emitters distributed over large volumes as it is required in solid-state lighting.

Here, use is made of periodic arrays of nanoparticles that behave as collective nano-antennas. Such arrays sustain collective plasmonic resonances. On the one hand, metallic nanoparticles have large scattering cross sections that allow resonant excitation of phosphors in the wavelength conversion material, enhancing the conversion of light. On the other hand, collective plasmonic resonances enable shaping the angular pattern of the emission, beaming most of the light into a very narrow angular range in a defined direction. Therefore, the directional enhancement is explained as the combination of an increased efficiency in the excitation of the wavelength conversion medium and an enhancement of the out-coupling efficiency of the emission of the phosphors to extended plasmonic-photonic modes in the array and the subsequent out-coupling to free-space radiation.

A more detailed description of the function of the plasmonic antenna array can be found in WO2012/098487.

The present invention is based on the realization that anisotropic light distribution can be achieved by configuring a plasmonic antenna array such that it supports resonance modes which are out-of-plane asymmetric and arranging a photon emitter in close proximity of the antenna array. In the present context, out-of-plane asymmetric means that the electromagnetic field of the resonance modes are different when excited from opposite directions in relation to the plane of the antenna array, which in turn leads an asymmetric angle distribution of light emitted from the antenna array. Thereby, the emission anisotropy can be configured so that a larger portion of the light emitted from the antenna array is emitted in a direction away from the photon emitter, compared to in a direction towards the photon emitter, such that a larger portion of generated photons may escape the illumination device. Accordingly, re-absorption is reduced and a higher efficiency is achieved as more of the light produced by the photon emitter is emitted from the illumination device. Furthermore, the anisotropic angle distribution makes it possible to also control the directionality of light emitted by the antenna array so that a majority of light is emitted in a relatively narrow angle range in relation to the plane of the antenna array. This may be particularly advantageous in applications where it is desirable to direct the emitted light in predetermined desirable directions. Accordingly, plasmonic antenna arrays can be integrated in lighting devices acting as efficient and compact secondary collimating optics. Plasmonic antenna arrays may therefore be useful for replacing collimating optics.

Plasmonic antenna arrays for increasing the directionality of emitted light also provide advantages in view of for example photonic crystals which require careful tuning of layer thickness and sizes.

A particular advantage of the present invention is that by arranging the photon emitter such that the spatial extension of the hybrid coupled LSPR and photonic modes of the plasmonic antenna array overlaps the photon emitter, coupling between the emitted photon and the plasmonic antenna array occur such that the direction of the emitted photon is controlled by the plasmonic antenna array in the same manner as discussed above.

Accordingly, for a photon emitter arranged such that coupling occurs between the photon emitter and the plasmonic antenna array, an emitted photon may be seen as being emitted from the coupled system comprising the photon emitter and plasmon antenna array. In general, the photon emitter in an excited state may either emit a photon directly, or through coupled emission where coupling occurs between the photon emitter and modes of the plasmonic antenna array.

In applications where an ensemble of photon emitters is used, and where the individual photon emitters have different emission wavelengths, the plasmonic antenna array may be configured such that the directionality of a particular wavelength is enhanced, thereby making it possible to also control the resulting spectra being emitted from the illumination device, at least for the particular emission angle range determined by the antenna array.

A photon emitter should be understood as any atom, molecule, particle or structure which is capable of being elevated in energy to an excited state through addition of energy, and where relaxation into a state of lower energy takes place through the emission of a photon.

In general, the photoluminescence enhancement (PLE), defined as the photoluminescence intensity measured from the photon emitter deposited over the array normalized by the photoluminescence of the same photon emitter in the absence of the array, accounts for phenomena occurring at the excitation and at the emission frequencies of the photon emitter. On the one hand, it depends on the local field at the excitation wavelength and the position where the photon emitter is located. On the other hand, the emission is modified due to the combined effect of (i) the local density of optical states to which an emitter can decay emitting radiation at the wavelength of emission; and (ii) the out-coupling of this emission to free space radiation in a particular solid angle.

Moreover, for a phosphor emitter, in addition to the directionality enhancement, due to the resonances at the emission frequency of the emitter, plasmonics also provide enhanced excitation efficiency/absorption cross section of the emitter due to resonant excitation at the pumping frequency.

Furthermore, the antenna array is formed as a regular lattice of antenna elements exhibiting long range symmetry. However a certain degree of asymmetry of the antenna array can be allowed while still achieving the desired effect of anisotropic light distribution.

The resonance frequency and bandwidth of the antenna array is governed by the distribution of antenna elements, i.e. the lattice, the geometry of antenna elements, the material from which the antenna elements are formed and by the materials and configuration of layers in the proximity of the antenna array. Thereby, a desired resonance frequency and bandwidth can be achieved by tuning the aforementioned parameters. A narrow frequency band can in the present context be understood as resonance frequencies corresponding to a wavelength range of a few nanometers. Although broader resonances (up to 30 nm FWHM) can be advantageous in LED applications in view of color rendering.

According to one embodiment of the invention, the photon emitter is arranged at a distance from said plasmonic antenna array such that a majority of the emitted photons are emitted by the coupled system comprising said photon emitter and said plasmonic antenna array. When coupling occurs between the emitted photon and the hybrid modes of the plasmonic antenna array, the energy of the photon is transferred to the array and the direction of the resulting emission is governed by the properties of the array. A high coupling efficiency of the emitted light into the resonance mode is desirable. In particular, it is desirable to maximize the coupling efficiency between the emitter and the plasmonic hybrid modes. By selectively positioning the photon emitters sufficiently close to the plasmonic antenna array, coupling efficiency may be increased, without entering into the regime of strong emitter-antenna coupling.

To achieve a high coupling efficiency, the distance between the photon emitter and one or more antenna elements of the plasmonic antenna array is preferably below 5 micrometers, more preferably below 2 micrometers. The suitable distance between the photon emitter and the antenna array can also be defined in terms of effective wavelengths corrected for the refractive index. The distance may then be up to 10 effective wavelengths, and in another embodiment up to 6 effective wavelengths. Alternatively, or additionally, the distance may advantageously be larger than 10 nanometers in order to avoid quenching.

In one embodiment of the invention, the photon emitter may advantageously be a point emitter being excited by an external energy source, the point emitter being selected from the group comprising a rare earth ion, a dye molecule and a quantum dot. In principle any point emitter may be used in the present context where excitation may result in the emission of a photon.

According to one embodiment of the invention, the external energy source may advantageously comprise an electron emitter, an x-ray emitter or a gamma-ray emitter. In principle any external energy source may be used to excite the point emitter, such as an electron having sufficiently high energy, x-ray or gamma radiation, heat, injection of electron-hole pairs etc. Electrons may for example be emitted by a cathode ray tube (CRT), x-rays and gamma-rays may for example be provided from a vacuum tube, for example Computed Tomography (CT) for X-rays and Positron Emission Tomography for gamma rays (PET).

In one embodiment of the invention the photon emitter may advantageously be a light emitting diode (LED) or a solid state laser. When for example a bar laser is used as the photon emitter, the direction of the emitted photon may be controlled to be emitted into a desired waveguide mode of the laser bar, so that the laser threshold is reduced. For a LED the emitted photon is within the escape cone of the semiconductor, thereby enhancing the light extraction efficiency of the device and allowing increased brightness. An advantage here is that less light is reflected back into the LED, which leads to reduced losses.

In one embodiment of the invention antenna array may be configured such that light emitted from the plasmonic antenna array has an anisotropic angle distribution such that a first portion of light emitted in a first direction perpendicular to the antenna array plane is larger than a second portion of light emitted in a second direction perpendicular to the antenna array plane, the second direction being the opposite of the first direction. By selecting the configuration of the out-of-plane asymmetry, it is possible to control the resulting emission of light from the light emitting device such that a larger portion of the generated photons are emitted in a direction out of the device compared to light emitted in an opposite direction, or vice versa. Light emitted in a first direction perpendicular to a plane should be interpreted as light emitted in an angle range being centered around the normal perpendicular to the plane.

Furthermore, in one embodiment of the invention, the plasmonic antenna array may be configured such that light emitted from the plasmonic antenna array has an anisotropic angle distribution such that a first angle distribution in a first direction in relation to the antenna array plane is different from a second angle distribution in a second direction in relation to the antenna array plane, the second direction being the opposite of the first direction. Thereby, the light distribution can be controlled, for example if a particular beam shape or pattern is desired. The anisotropic angle distribution may advantageously be combined with the aforementioned difference in angle distribution related to the amount of photons so that a majority of emitted photons is emitted in a desirable direction, in which direction the emitted light has a beam shape which depends on the configuration of the antenna array.

According to one embodiment of the invention, the antenna elements may be arranged on a first layer having a first refractive index, and the antenna elements may further be embedded in a second layer having a second refractive index different from the first refractive index. One way to achieve the aforementioned out-of-plane asymmetric resonance modes is to arrange the antenna elements in an environment having asymmetric dielectric properties. As the frequency dependent dielectric constant of a material is related to the refractive index of the material, materials having different refractive indices suitable for use in lighting applications can be selected such that an asymmetric electromagnetic environment is experienced by the antenna array through the difference in dielectric constant. Furthermore, the radiative coupling in particle arrays can be enhanced by diffracted orders propagating in the plane of the array and guided modes supported by the photonic structure. The latter consists on the hybridization of guided modes in thin dielectric layers with LSPRs of antenna elements in the proximity of the guiding layer. These hybrid modes require a wave-guiding structure, i.e. the refractive index of the guiding layer must be higher than the surrounding material.

In one embodiment of the invention, the antenna elements may be arranged on a first layer and embedded in and covered by a second layer, and wherein a third layer may be arranged on the second layer, the third layer having a refractive index different from a refractive index of the second layer.

The asymmetric dielectric environment may be achieved in many different ways, and alternative arrangements of layers of materials having different dielectric properties may be used to achieve the desired asymmetry. For example, stacks of different materials may be used. In principle, the exact position of the boundary of the different layers in relation to the antenna elements is not crucial as the resonant modes will experience an average of the dielectric properties, related to their mode profile.

The mode profile relates to the spatial distribution of the electric field. By reciprocity, the intensity of the emission in a certain direction from a particular wavelength conversion molecule in a wavelength converting layer is equal to the local-field intensity at the place of that emitter due to a plane wave incident on the array from the mentioned direction. This has been shown by numerical three dimension finite-difference in time-domain (FDTD) simulations. In particular, it has been observed that the electric field enhancement of this resonance extends over the polymer layer, leading to an enhancement of the light-matter interaction in the direction normal to the plane of the array. Furthermore, for particular geometries, the electric field enhancement in the wavelength conversion layer may be larger when the structure is illuminated from the substrate side rather than from the opposing side. The anisotropic behavior of the local-field intensity enhancement will give rise to an asymmetry in the forward to backward emission.

In one embodiment of the invention, the wavelength conversion material may be comprised in the aforementioned third layer. Thereby, the wavelength conversion material does not surround the antenna elements. Furthermore, the second layer may extend above each of the antenna elements by at least 10 nm so that it is ensured that the wavelength conversion material is not at all in contact with the antenna elements. This may be advantageous as the wavelength conversion material may disturb the resonance modes of the antenna elements.

According to one embodiment of the invention, each of the plurality of antenna elements may advantageously have an asymmetric shape. An alternative way of achieving the required out-of plane asymmetric plasmon resonance modes is to make the antenna elements asymmetric. Thereby, the resulting resonant modes for each antenna element become asymmetric which in turn leads to asymmetric light emission properties. The asymmetric shape of the antenna element refers to the asymmetry of a cross section of such an element in a plane parallel to the longitudinal axis of the antenna element, i.e. cross section in a vertical plane of a "standing" antenna element.

In one embodiment of the invention, each of the plurality of antenna elements may advantageously have the shape of a pyramid, a truncated pyramid, a cone or a truncated cone. The tapering of the antenna element is important for the anisotropy of the emission. In particular, the anisotropy is based on the simultaneous excitation of electric and magnetic resonances in the antenna elements. As will be further explained below, it is mainly the magnetic and magneto-electric (cross-coupled) response which is enhanced by the broken symmetry. The magnetic response is the response of the antenna element to the magnetic field of the incident light, whereas magneto-electric refers to the excitation of electric fields by incident magnetic fields, and vice versa.

It is known from electrodynamics that a single electric dipole coupled to a single magnetic dipole can tailor the forward/backward scattering ratio depending on the relative phase of the dipoles. Typically, most materials do not have a magnetic response at optical frequencies, so the effect is hardly found for light. However, metallic nanostructures can be designed to sustain magnetic excitations of strength comparable to their electric ones. Moreover, these two different excitations may cross-couple, leading to a magneto-electric response.

Increasing the tapering of the antenna elements (where tapering refers to the ratio of the diameter at the base to the diameter at the top) increases both the magnetic and the magneto-electric response. Thus, by increasing the tapering, the two responses are increased and an antenna array exhibiting an increased anisotropy can be designed. It is also noted that the anisotropy of emission from these structures relies on them having electric and magnetic excitations of similar amplitudes.

In one embodiment of the invention, an antenna element in the shape of a truncated pyramid may have a bottom side length in the range of 100 to 300 nm and a top side length in the range of 30 to 150 nm, and an antenna element in the shape of a truncated cone may have a bottom diameter in the range of 100 to 300 nm and a top diameter in the range of 30 to 100 nm.

Furthermore, the antenna elements may advantageously have a height in the range of 50 to 400 nm, preferable in the range of 100 to 200 nm. In general, with reference to the aforementioned size ranges, arrays based on smaller antenna elements are resonant more towards the blue end of the visible spectrum in comparison to larger antenna elements which are resonant more towards the red end of the visible spectrum.

The total size of the antenna element is of importance for the localized plasmon resonance. The base and top support localized modes, where a difference in size of top and bottom broaden the combined local resonance of the antenna.

There are different resonances for top and bottom of a truncated antenna element, and the top and bottom resonances can couple to each other. Then, the height of the antenna element will introduce a phase delay and govern the coupling of the resonances, thereby determining the anisotropy, partly due to retardation partly due to electro and magnetic resonances.

According to one embodiment of the invention, the antenna elements may advantageously comprise a metal, in particular the antenna elements may advantageously comprise Ag, Al, Ga or Au. The material from which the antenna elements are formed should preferably support localized plasmons at frequencies corresponding to visible light. In general, Au is more suitable for the red to near-infrared part of the spectrum, Ag for the green to red part of the spectrum and Al allows for plasmon resonances that extend beyond the visible region of the spectrum into the ultraviolet.

It would also be possible to use antenna elements made from a dielectric material. However, such an antenna array comprising dielectric antenna elements would provide resonances having a narrower bandwidth compared to an antenna array comprising metallic antenna elements.

According to one embodiment of the invention, the illumination device may advantageously comprise a first periodic plasmonic antenna array in a first portion of the illumination device and a second periodic plasmonic antenna array in a second portion of the illumination device, wherein the first periodic plasmonic antenna array is configured to comprise out-of plane asymmetric plasmon resonance modes in a first wavelength range, and the second periodic plasmonic antenna array is configured to comprise out-of plane asymmetric plasmon resonance modes in a second wavelength range, different from the first wavelength range. In order to provide an illumination device where light may be emitted anisotropically in a wide range of wavelengths, it may be advantageous to provide two or more separate plasmonic antenna arrays tailored for emission in different wavelength ranges. Such an illumination may be made more efficient compared to if one antenna array is to be used to provide light in a broad wavelength range, such as for example the visible spectra.

The two or more plasmonic antenna array may differ in one or more of the abovementioned parameters which influence the emission wavelength, such parameters including material, geometry and shape of the antenna element, lattice geometry of the array, dielectric environment etc.

In one embodiment of the invention, the illumination device may advantageously comprise a first and second periodic plasmonic antenna array which are non-overlapping and are arranged in the same plane. Two different antenna arrays comprising metallic antenna elements which are overlapping in the same antenna array plane may disturb each other such that the efficiency of the emission anisotropy is reduced, therefore, it may be advantageous to arrange two such array adjacent to each other in the same plane covering different area portions in the illumination device. However, a first antenna array comprising metallic antenna elements may advantageously overlap a second antenna array where the antenna elements comprise a dielectric material. The narrow band resonance from the dielectric array can be tuned to not overlap and thereby not disturb the plasmonic resonances of the metallic antenna array. Instead, the dielectric array could advantageously be used for pump enhancement of the metallic array. The emission process involves two different frequencies: the emission frequency and the excitation frequency. Accordingly, the overall emission enhancement can be thus factorized into two contributions: the emission enhancement and the excitation enhancement or pump enhancement. The absorption of the emitting wavelength conversion layer, and consequently its emission, can be increased by an enhancement of the total electric near-field intensity at the pumping frequency in the regions of space where the wavelength conversion molecules are located. Since metallic nanoparticles present inherent losses because of their conductivity, it is required to maximize the optical absorption in the wavelength conversion layer while minimizing the power absorbed in the metal. This issue could be completely overcome by using nanoparticles made of a dielectric material since a dielectric can be chosen that does not present any parasitic absorption at the pumping frequency.

In one embodiment of the invention, the first and second periodic plasmonic antenna arrays may advantageously be arranged in different planes. By arranging differently configured antenna arrays in different planes, i.e. by providing a stack of arrays, anisotropic emission in a broader wavelength range may be provided from a particular device.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail with reference to the appended drawings showing example embodiments of the invention, wherein.

DETAILED DESCRIPTION OF PREFERRED EMBODIMENTS OF THE INVENTION

The present invention will now be described more fully hereinafter with reference to the accompanying drawings, in which exemplary embodiments of the invention are shown. This invention may, however, be embodied in many different forms and should not be construed as limited to the embodiments set forth herein; rather, these embodiments are provided for thoroughness and completeness, and fully convey the scope of the invention to the skilled person. Like reference characters refer to like elements throughout.

Figure 1A:
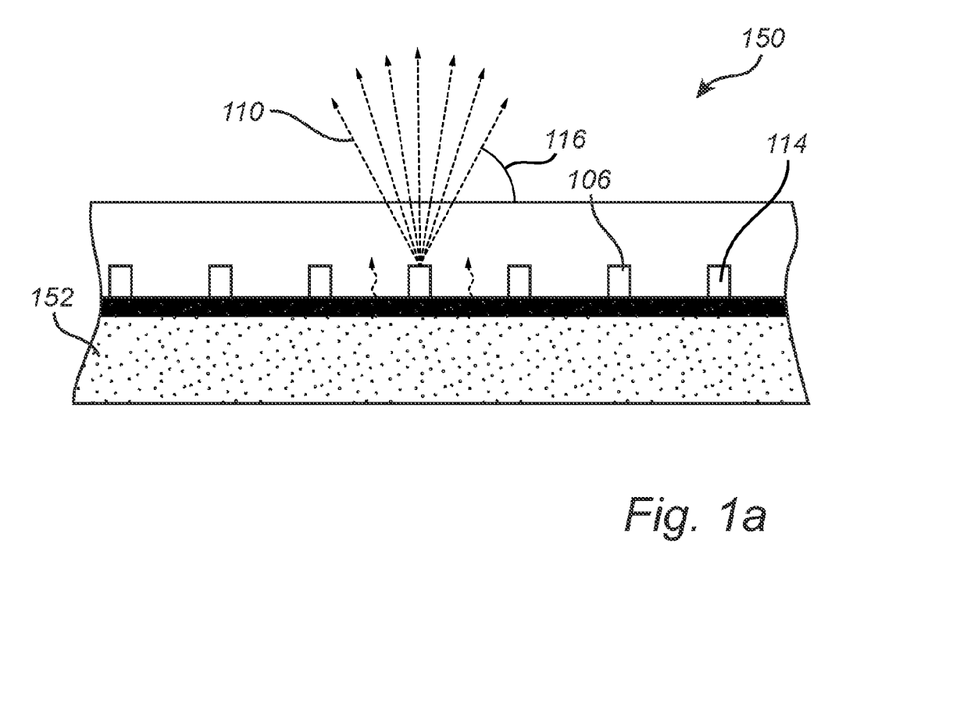
FIGS. 1a-c schematically illustrates an illumination device according to embodiments of the invention.
Figure 1B:
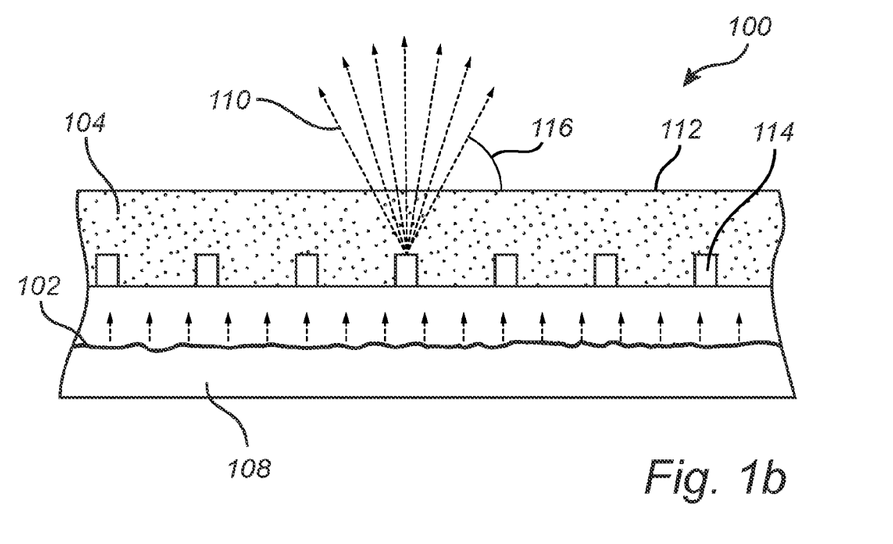
Figure 1C:
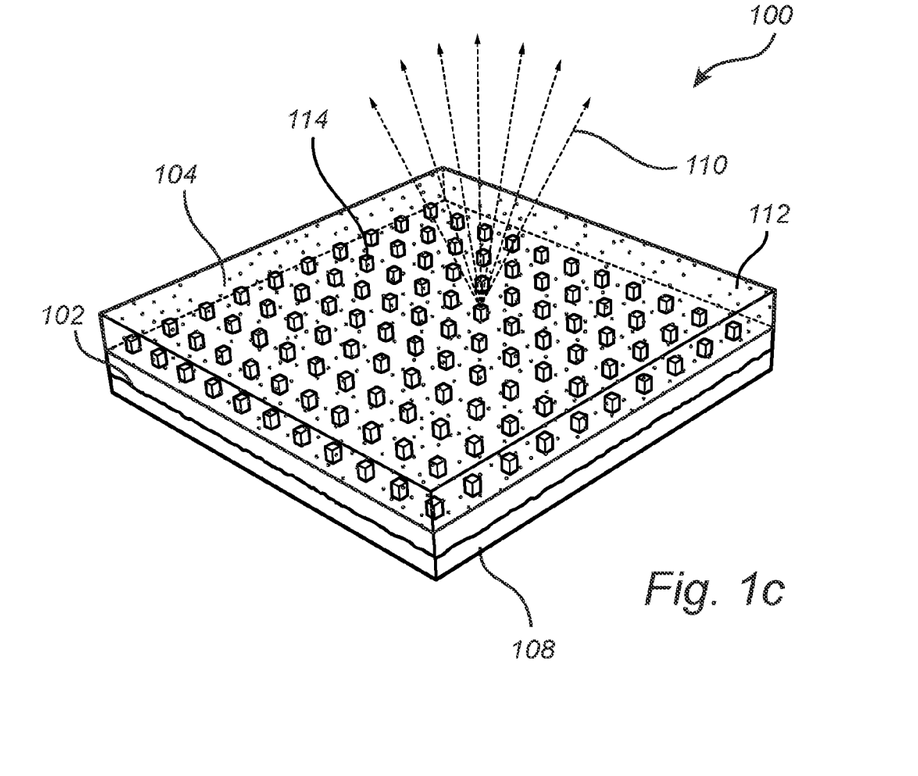

FIG. 1a is a schematic illustration of an illumination device 150 comprising a plurality of photon emitters 152 arranged in close proximity to a periodic plasmonic antenna array 114 comprising a plurality of individual antenna elements 106 arranged in an antenna array plane as illustrated by FIG. 1c. The antenna array 114 is here arranged on a substrate 108, which is illustrated to comprise the photon emitter 102.

The distance between the photon emitter and one or more antenna elements of the plasmonic antenna array is preferably below 5 micrometers in another embodiment below 10 effective wavelengths and in yet another embodiment below 6 effective wavelengths. Additionally, or alternatively, the distance may advantageously be larger than 10 nanometers in order to avoid quenching. The distance between the photon emitter and the plasmonic antenna array can in general be very well controlled using known manufacturing methods. The distance between the photon emitter and the antenna element(s) of the antenna array may be measured from any direction, for example to the top, side or bottom of the antenna element(s).

The photon emitter 102 is here shown as a point emitter which is capable of being excited by an external energy source. The point emitter may for example be a rare earth ion, a dye molecule or a quantum dot. The external energy source for exciting the point emitter may for example be an electron emitter, an x-ray emitter or a gamma-ray emitter, or the point emitter may be excited through injection of electron-hole pairs.

In principle any external energy source may be used to excite the point emitter, such as an electron having sufficiently high energy, x-ray or gamma radiation, heat, injection of electron-hole pairs etc. Electrons may for example be emitted by a cathode ray tube (CRT), x-rays and gamma-rays may for example be provided from a vacuum tube, for example Computed Tomography (CT) for X-rays and Positron Emission Tomography for gamma rays (PET).

However, the photon emitter may equally well be an active component such as a LED or a solid state laser, where electric energy is provided from an external energy source to achieve photon emission form the component.

FIG. 1b is a schematic illustration of an illumination device 100 comprising an external energy source in the form of a light-source 102 configured to emit light of a first wavelength, a wavelength conversion layer 104 arranged adjacent to the light source to receive light from the light source and to convert light from the first wavelength to a second wavelength. The wavelength conversion layer 104 comprises a wavelength conversion medium in the form of molecules or particles for converting light having a first wavelength into light having a second wavelength. Here, the molecules or particles in the wavelength conversion medium correspond to the photon emitters, which are in this case excited by light from the light source 102. The distance between the photon emitter and the plasmonic antenna array can for example be controlled by controlling the thickness of the wavelength conversion layer 104 or by controlling the distribution of photon emitter within the layer. Furthermore, the wavelength conversion layer 104 may also be referred to as the emission layer which emits light from the illumination device 100. Different types of wavelength converting materials known to person skilled in the art may be used. Wavelength converting materials may also be referred to as fluorescent materials, phosphors or dyes. Also in this application is it possible to use quantum dots or rare earth ions as a wavelength converting photon emitter. Here, the light source 102 is illustrated as a region from which light is emitted, such as in a semiconductor light emitting diode formed in a semiconductor substrate 108. However, the external energy source 102 may equally well be a discrete component such as a light emitting diode or a laser, arranged separately and at a distance from the wavelength conversion material and from the remainder of the illumination device. The illumination device 100 further comprises a periodic plasmonic antenna array 114 comprising a plurality of individual antenna elements 106 arranged in an antenna array plane as illustrated by FIG. 1b. The antenna array is here arranged on the substrate 108 and within the wavelength conversion layer 104 to couple to the photon emitters such that photons may be emitted by the coupled system comprising the photon emitter and the antenna array. Accordingly, the antenna array is configured to support surface lattice resonances at the wavelength of photons emitted by the photon emitter, arising from diffractive coupling of localized surface plasmon resonances in the individual antenna elements. In FIG. 1a-c the antenna elements 106 are illustrated as having a square cross section, however, the antenna elements may equally well have a polygonal or circular cross section. Moreover, the plasmonic antenna array is configured to comprise plasmon resonance modes being out-of plane asymmetric, such that light emitted from said plasmonic antenna array has an anisotropic angle distribution as illustrated by the light distribution 110. The anisotropic angle distribution from the plasmonic antenna array 114 has the effect that more of the light emitted by the antenna array 114 is emitted towards the emitting surface 112 of the illumination device than what is emitted towards the substrate. The plasmonic antenna array can also be configured to provide the opposite effect, i.e. that more of the light emitted by an antenna array is emitted towards the substrate compared to what is emitted towards the light emitting surface. That may for example be useful when using a transparent substrate. Also, the angle distribution of emitted light from the light emitting surface 112 can be controlled, illustrated by the angle 116, such that light is emitted within a predetermined angle range.

Out-of-plane asymmetric plasmon resonance modes can be achieved as illustrated in FIGS. 1a to 1c by selecting the refractive index of the layer in which the plasmonic antenna array is arranged to be different from the refractive index of the substrate 108.

Figure 2A:
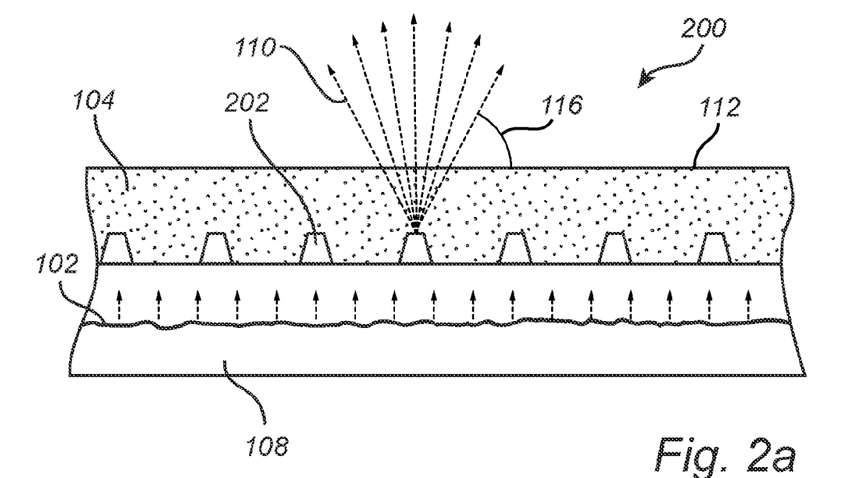
FIGS. 2a and 2b schematically illustrate an illumination device according to an alternative embodiment of the invention.
Figure 2B:
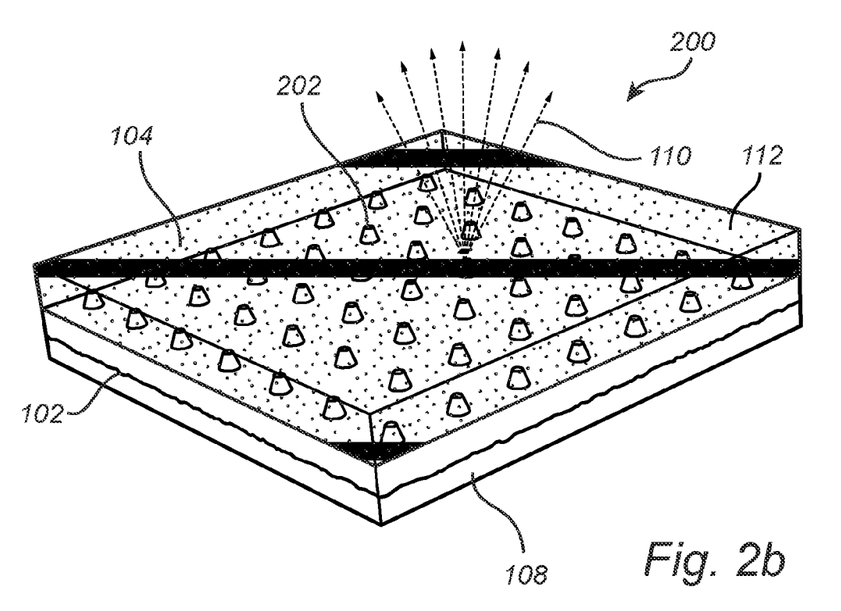

Out-of-plane asymmetric plasmon resonance modes can also be achieved by using asymmetric antenna elements as illustrated in the illumination device 200 of FIGS. 2a and 2b where a truncated conical antenna element 202 is shown. Other asymmetric shapes are also possible, such as a cone, a pyramid or a truncated pyramid having any polygonal base.

Figure 3:
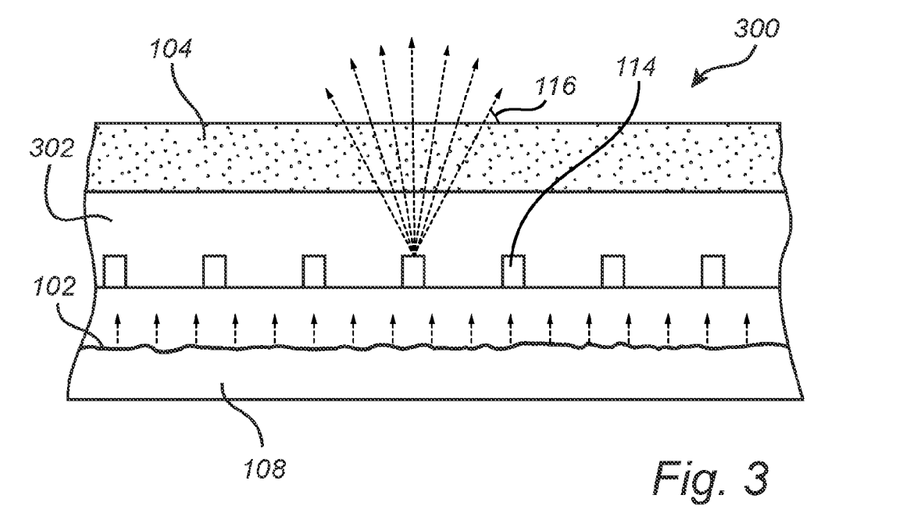
FIG. 3 schematically illustrates an illumination device according to an alternative embodiment of the invention.

FIG. 3 illustrates an illumination device 300 where the antenna elements 106 are arranged on the substrate 108 and embedded in an intermediate layer 302 on top of which a wavelength conversion layer 104 is arranged. Here, the refractive index of the intermediate layer 302 is different from the refractive index of the wavelength conversion layer 104 so that out-of-plane asymmetry is achieved through the asymmetric dielectric environment seen by the antenna elements 106.

Figure 4A:
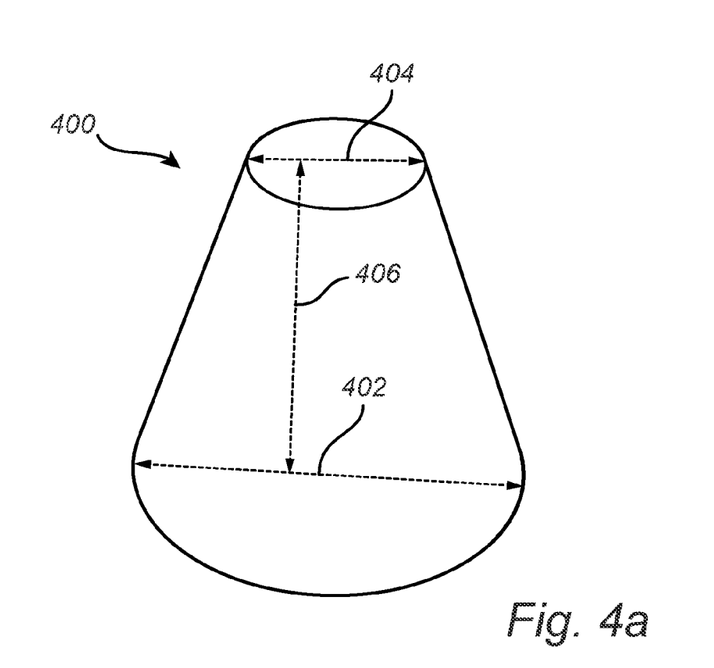
FIGS. 4a-d schematically illustrates an element of an illumination device according to an embodiment of the invention.
Figure 4B:
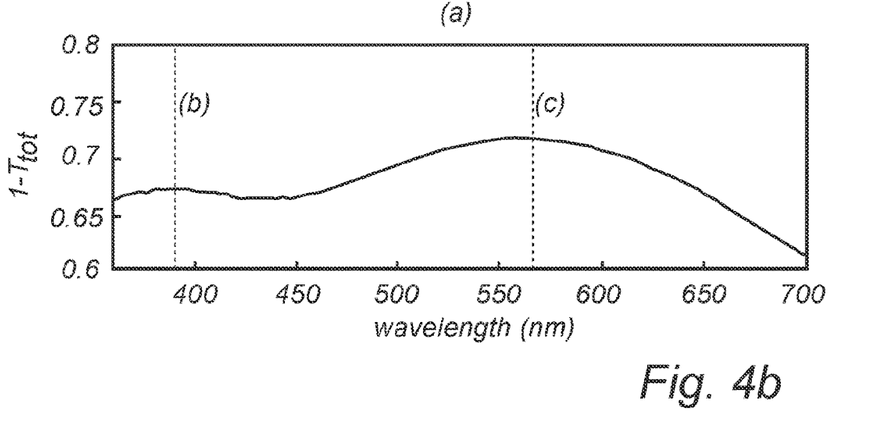
Figure 4C:
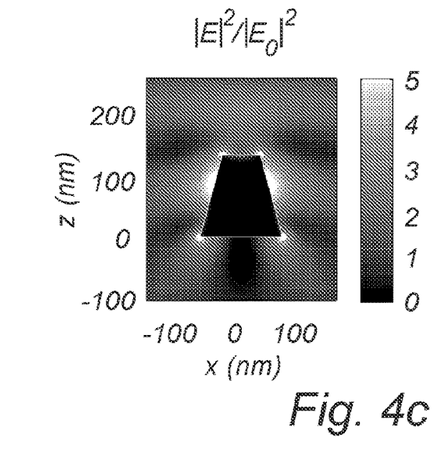
Figure 4D:
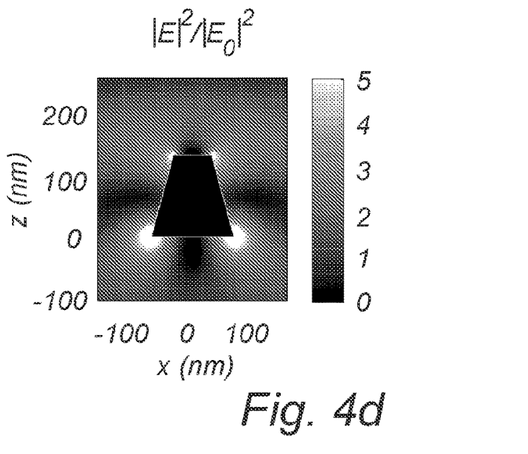

FIG. 4a illustrates an antenna element in the form of an aluminum nanoparticle having a base 402 diameter of 130 nm, a top 404 diameter of 60 nm and a height 406 of 130 nm. FIGS. 4b, 4c and 4d further show numerical simulations of how the base 402 and the top 404 of the antenna element 400 support different localized resonance modes for different wavelengths. In particular, it can be seen that resonance modes of the smaller top 404 of the antenna element 400 is more towards the blue end of the wavelength spectrum and that resonance modes of the larger base 402 of the antenna element 400 is more towards the red end. Furthermore, the height of the antenna element is important for determining the coupling between the top and bottom resonance modes.

Figure 5A:
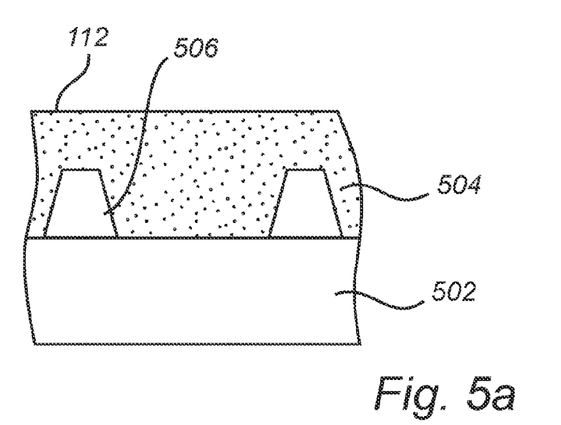
FIGS. 5a-b schematically illustrates an illumination device according to an embodiment of the invention.

FIG. 5a schematically illustrates an illumination device 500 comprising an antenna array where the antenna elements are provided in the form of truncated cones having a base diameter of 140 nm, a top diameter of 80 nm and a height of 150 nm. The antenna elements 506 are arranged in a square array having a pitch of 400 nm. Furthermore, the antenna elements 506 are arranged on a SiO2 layer having a refractive index of 1.44, and they are embedded in a wavelength conversion layer 504 comprising a red dye and having a refractive index of 1.58. The wavelength conversion layer 504 is on the other side in contact with air having a refractive index of 1. In FIG. 5a, the light source is not shown.

Figure 5B:
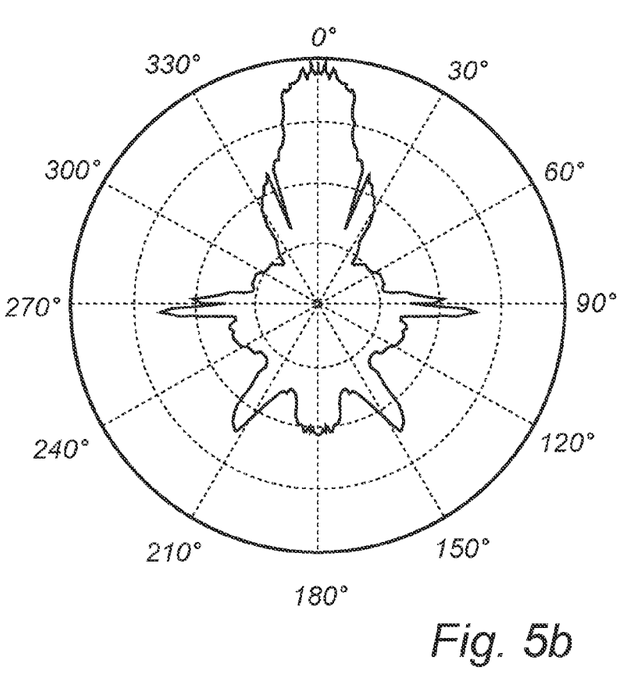

For the illumination device 500 illustrated in FIG. 5a, FIG. 5b is a resulting polar plot showing the emission of light having a wavelength of 650 nm when light having a wavelength of 442 nm is provided by a light source, which for example may be a blue LED. In FIG. 5b, 0° and 180° correspond to directions perpendicular to the light emitting surface 112 of the device, where 0° is the direction from the wavelength conversion layer 504 towards the SiO2 layer 502 and 180° is the direction perpendicular to the light emitting surface 112 towards the ambient air. As can be seen, the emission is anisotropic both with respect to the amount of light being emitted in the opposing directions perpendicular to the surface of the illumination device, and with respect to the shape of the beam in the respective directions. It should further be noted that the illustrated angle distribution is substantially independent of the position of the light source, meaning that in principle a light source may be placed on either side of the structure shown in FIG. 5a. For example by using transparent substrates, this provides an increased flexibility in the configuration of an illumination device.

Figure 6:
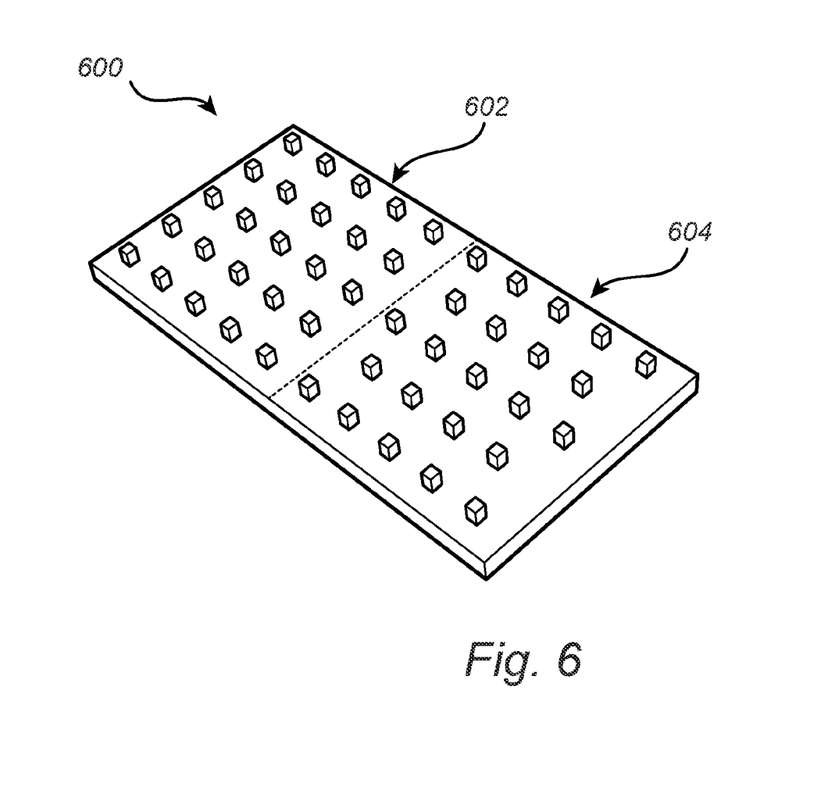
FIG. 6 schematically illustrates an illumination device according to an embodiment of the invention.

FIG. 6 illustrates an example illumination device 600 where different plasmonic antenna arrays 602, 604, are arranged on different area portions of the illumination device 600. Thereby, each plasmonic antenna array can be tailored to emit light within a predetermined wavelength range which may be a subset of the visible spectrum so that an overall emission from the illumination device is provided as a homogeneous emission of white light having an angle distribution determined by the configuration of the antenna arrays. As is readily realized, any number of differently configured antenna arrays according to various embodiments of the invention may be combined to achieve the desired emission properties.

Even though the invention has been described with reference to specific exemplifying embodiments thereof, many different alterations, modifications and the like will become apparent for those skilled in the art. For example, the plasmonic antenna array may be configured in many different ways to achieve different asymmetric angle distributions of emitted light. Furthermore, the illumination device may also be configured to emit light of different wavelengths or within different wavelength ranges. In particular, although the illumination device mainly has been described with reference to emission of visible light, various embodiments of the invention are equally applicable in applications where it may be desirable to emit light in the ultraviolet or infrared spectra. Also, it should be noted that parts of the system may be omitted, interchanged or arranged in various ways, the illumination device yet being able to perform the functionality of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. An illumination device, comprising:
   a photon emitter configured to emit photons of a wavelength; and a periodic plasmonic antenna array comprising a plurality of individual antenna elements arranged in an antenna array plane, wherein:
- said plasmonic antenna array is arranged in close proximity of said photon emitter such that at least a portion of said photons are emitted by a coupled system comprising said photon emitter and said plasmonic antenna array;
- said individual antenna elements are out-of-plane asymmetric and have a height such that a ratio between the height of the antenna elements and the wavelength is in the range of 0.143 to 0.385; and
- said plasmonic antenna array is configured to:
  - support surface lattice resonances at the wavelength, arising from diffractive coupling of localized surface plasmon resonances in said individual antenna elements; and
  - comprise plasmon resonance modes being out-of-plane asymmetric, such that light emitted from said plasmonic antenna array has an anisotropic angle distribution in relation to said antenna array plane.

2. The illumination device according to claim 1, wherein said photon emitter is arranged at a distance from said plasmonic antenna array such that a majority of the emitted photons are emitted by the coupled system comprising said photon emitter and said plasmonic antenna array.

3. The illumination device according to claim 1, wherein said photon emitter is a point emitter capable of being excited by an external energy source, said point emitter being selected from the group comprising rare earth ions, dye molecules quantum dots and metal clusters.

4. The illumination device according to claim 3, further comprising an external energy source in the form of a photon emitter, an electron emitter, an x-ray emitter or a gamma-ray emitter or an electron-hole pair.

5. The illumination device according to claim 1, wherein said photon emitter is a light emitting diode or a solid state laser.

6. The illumination device according to claim 1, wherein said plasmonic antenna array is configured such that light emitted from said plasmonic antenna array has an anisotropic angle distribution such that a first portion of light emitted in a first direction perpendicular to said antenna array plane is larger than a second portion of light emitted in a second direction perpendicular to said antenna array plane, said second direction being the opposite of said first direction.

7. The illumination device according to claim 1, wherein said plasmonic antenna array is configured such that light emitted from said plasmonic antenna array has an anisotropic angle distribution such that a first angle distribution in a first direction in relation to said antenna array plane is different from a second angle distribution in a second direction in relation to said antenna array plane, said second direction being the opposite of said first direction.

8. The illumination device according to claim 1, wherein said antenna elements are arranged on a first layer having a first refractive index, and wherein said antenna elements are embedded in a second layer having a second refractive index different from said first refractive index.

9. The illumination device according to claim 1, wherein said antenna elements are arranged on a first layer and embedded in and covered by a second layer, and wherein a third layer is arranged on said second layer, said third layer having a refractive index different from a refractive index of said second layer.

10. The illumination device according to claim 1, wherein each of said plurality of antenna elements has an asymmetric shape.

11. The illumination device according to claim 1, wherein each of said plurality of antenna elements has the shape of a pyramid, a truncated pyramid, a cone or a truncated cone.

12. The illumination device according to claim 11, wherein an antenna element in the shape of a truncated pyramid has bottom side length in the range of 100 to 300 nm and a top side length in the range of 30 to 150 nm, and an antenna element in the shape of a truncated cone has bottom diameter in the range of 100 to 300 nm and a top diameter in the range of 30 to 100 nm, and a height in the range of 100 to 200 nm.

13. The illumination device according to claim 1, wherein said antenna elements comprises a metal selected from the group comprising Ag, Al, Ga and Au.

14. The illumination device according to claim 1, comprising a first periodic plasmonic antenna array in a first portion of said illumination device and a second periodic plasmonic antenna array in a second portion of said illumination device,
wherein said first periodic plasmonic antenna array is configured to comprise out-of-plane asymmetric plasmon resonance modes in a first wavelength range, and said second periodic plasmonic antenna array is configured to comprise out-of-plane asymmetric plasmon resonance modes in a second wavelength range, different from said first wavelength range.

15. The illumination device according to claim 14, wherein said first and second periodic plasmonic antenna array are non-overlapping and are arranged in the same plane or wherein said first and second periodic plasmonic antenna array are arranged in different planes.

16. The illumination device according to claim 1, wherein the periodic plasmonic antenna array is arranged on a portion of said illumination device not covered by another periodic plasmonic antenna array.

* * * * *